(12) United States Patent
Gaasch et al.

(10) Patent No.: US 6,636,062 B2
(45) Date of Patent: Oct. 21, 2003

(54) TEMPERATURE CONTROL DEVICE FOR AN ELECTRONIC COMPONENT

(75) Inventors: Thomas Francis Gaasch, Encinitas, CA (US); Thanh Trieu, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 09/829,541

(22) Filed: Apr. 10, 2001

(65) Prior Publication Data

US 2002/0145439 A1 Oct. 10, 2002

(51) Int. Cl.[7] ............................................... G01R 31/02
(52) U.S. Cl. ..................................... 324/760; 324/158.1
(58) Field of Search ............................ 324/760, 158.1, 324/765, 755; 165/80.2, 80.3, 80.4, 80.5

(56) References Cited

U.S. PATENT DOCUMENTS

| | | |
|---|---|---|
| 3,724,536 A | 4/1973 | Baxter |
| 4,839,587 A * | 6/1989 | Flatley et al. ............... 324/760 |
| 5,006,796 A * | 4/1991 | Burton et al. ............... 324/760 |
| 5,164,661 A | 11/1992 | Jones |
| 5,315,240 A | 5/1994 | Jones |
| 5,420,521 A | 5/1995 | Jones |
| 5,821,505 A | 10/1998 | Tustaniwskyj et al. |
| 5,844,208 A | 12/1998 | Tustaniwskyj et al. |
| 5,847,366 A | 12/1998 | Grunfeld |
| 5,907,246 A * | 5/1999 | Abraham et al. ........... 324/760 |
| 5,911,897 A | 6/1999 | Hamilton |
| 5,918,665 A | 7/1999 | Babcock et al. |
| 5,977,785 A * | 11/1999 | Burward-Hoy ............. 324/760 |
| 6,119,460 A | 9/2000 | Huang |
| 6,144,215 A | 11/2000 | Maxwell et al. |
| 6,322,626 B1 * | 11/2001 | Shirley ........................ 118/73 |

* cited by examiner

*Primary Examiner*—Ernest Karlsen
(74) *Attorney, Agent, or Firm*—Gray Cary Ware & Freidenrich (57) ABSTRACT

A combined heater and heat sink assembly regulates the temperature of a device under test. The combined heating/cooling assembly includes a heater assembly inlay that is received within a heat sink. The heater assembly includes a heating surface that is coplanar with a cooling surface of the heat sink. In operation, the heating/cooling assembly provides concurrent hot and cold contact points for the device under test. The heater assembly is thermally insulated from the heat sink such that the majority of the heat generated by the heater assembly is directly applied to the device under test; very little of the generated heat is lost to the heat sink. On the other hand, the heat sink provides a relatively low thermal resistance between the device under test and a cold source such as a coolant. Accordingly, the combined heating/cooling assembly provides parallel thermal paths between the device under test and both a hot source and a cold source.

22 Claims, 8 Drawing Sheets

TEMPERATURE CONTROL DEVICE FOR AN ELECTRONIC COMPONENT

FIELD OF THE INVENTION

The present invention relates generally to test equipment for electronic devices. More particularly, the present invention relates to a temperature control device for maintaining constant operating temperature of an electronic device under test.

BACKGROUND OF THE INVENTION

Electronic devices, such as integrated circuit chips, are usually tested prior to use. Device manufacturers typically perform a number of electrical and physical tests to ensure that the devices are free from defects and that the devices function according to their specifications. Common types of device testing include burn-in testing and electrical performance testing.

The operating temperature of an electronic device under test (DUT) is an important test parameter that usually requires careful monitoring and/or regulating. For example, an electrical test procedure may designate a number of specific test temperatures or a specific range of test temperatures. Consequently, the prior art is replete with different types of temperature control systems, heat sink components, and heater elements designed to heat, cool, and otherwise control the operating temperature of a DUT. These temperature control systems are designed to maintain a steady state DUT operating temperature during the electronic testing procedure. However, it can be difficult to regulate the temperature of a DUT if the DUT exhibits rapid or excessive internal temperature changes while being tested; the electronic devices within the DUT often generate heat which causes such internal temperature changes.

Active thermal control (ATC) systems measure, derive, or estimate the real-time temperature of a DUT while it is being tested and utilize the real-time DUT temperature to control the operations of ATC system components. Most ATC systems employ a cooling component such as a heat sink, a fan element, a radiator, or the like, and a heater. Thus, if the temperature of the DUT exceeds the specified test temperature, then the temperature of the heater within the heater/heat sink unit can be reduced and/or the operation of the cooling component can be adjusted to increase its effect. If the temperature of the DUT is less than the specified test temperature, then the temperature of the heater can be increased and/or the operation of the cooling component can be adjusted to decrease its effect. Some prior art ATC systems utilize a heat sink layer covered by a heater element. In this configuration, excess heat from a DUT must pass through the heater element or layer before it reaches the heat sink. Consequently, this prior art configuration may not be capable of efficiently and effectively compensating for rapid temperature fluctuations generated by the DUT.

BRIEF SUMMARY OF THE INVENTION

A preferred embodiment of the present invention is realized as a combined heater and heat sink assembly. The assembly can be used in an active thermal control system that regulates the temperature of an electronic device under test (DUT). The assembly is suitably configured to reduce the thermal resistance between the DUT and a thermal cold source or heat sink, while concurrently reducing the thermal resistance between the DUT and a thermal hot source or heater. In other words, the assembly is configured such that the DUT is concurrently exposed to relatively hot and cold sources. This allows faster thermal response time such that the control system can quickly add heat to or remove heat from the DUT in response to fluctuations in the test temperature of the DUT.

The above and other aspects of the present invention may be carried out in one form by a temperature control apparatus that includes a heater assembly configured to directly heat a DUT and a heat sink configured to provide a direct thermal path between the DUT and a cold source.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

Figure 1:
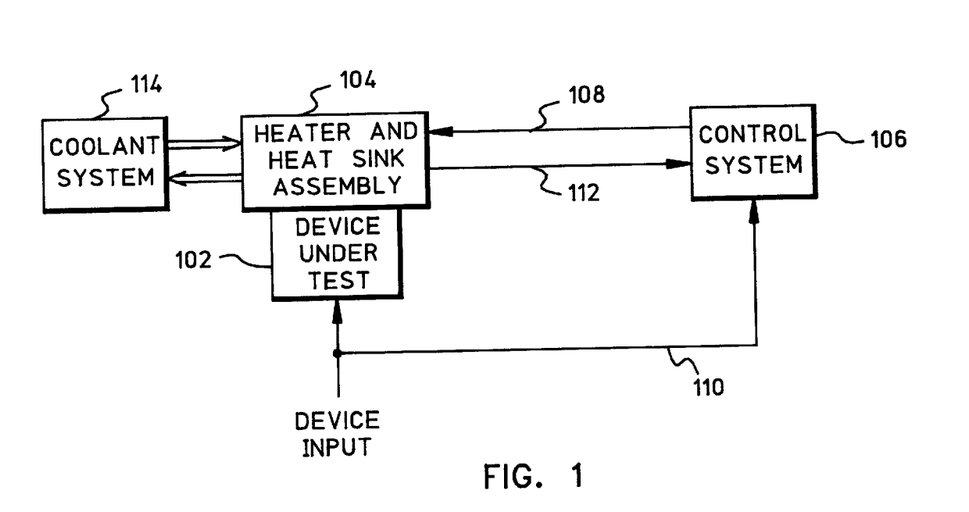
FIG. 1 is a schematic diagram of an active thermal control (ATC) system for regulating the temperature of a device under test (DUT)

FIG. 1 is a schematic diagram of an active thermal control (ATC) system 100 for regulating the temperature of a device under test (DUT) 102. For purposes of the example embodiment described herein, DUT 102 is an electronic semiconductor circuit device, such as a microprocessor chip. Alternatively, DUT 102 may be any electronic, mechanical, or other device being subjected to one or more tests performed under specific temperature settings. ATC system 100 may cooperate with a suitable testing system (not shown) that provides a power supply, input signals, and possibly other inputs to DUT 102. A typical testing system also monitors a number of outputs and signals generated by DUT 102 during the test procedure.

DUT 102 is preferably held against or in close proximity to a heating/cooling assembly 104, which is configured to concurrently provide a hot source and a cold source to DUT 102. In the preferred embodiment, a portion of DUT 102, such as the device lid, contacts heating/cooling assembly 104. In a practical embodiment, heating/cooling assembly 104 is coupled to a chuck assembly (not shown) and DUT 102 is cradled in a compatible carrier (not shown). The chuck assembly and carrier are clamped together during thermal conditioning, testing, and cool-down of DUT 102. In response to such clamping, DUT 102 is forced into physical contact with heating/cooling assembly 104. Such clamping ensures that heat is effectively transferred between DUT 102 and heating/cooling assembly 104. Alternatively, DUT 102 may be held against heating/cooling assembly 104 using a vacuum device or any suitable holding mechanism.

The temperature of heating/cooling assembly 104 (in particular, the temperature of the hot source or heater element) is regulated by a suitably configured regulator, e.g., a control system 106. In the illustrated embodiment, control system 106 generates a heater control signal 108 that serves as an input signal to a heater element contained in heating/cooling assembly 104. Heater control signal 108 may be generated by control system 106 in response to one or more testing criteria, operating conditions, or feedback signals. For example, control system 106 may generate heater control signal 108 in response to any of the following parameters: a test temperature setting associated with the current testing specification for DUT 102; an input signal utilized by DUT 102, e.g., an input power signal, an input voltage, or an input current; a signal indicative of the real-time operating temperature of DUT 102; a signal indicative of the real-time operating temperature of an internal component of DUT 102, e.g., a semiconductor die; a signal indicative of the real-time temperature of a portion of heating/cooling assembly 104; the RF signature of DUT 102; or the like.

In accordance with one practical embodiment, control system 106 receives a signal 110 indicative of the input power to DUT 102 and a signal 112 indicative of the real-time operating temperature of a portion of DUT 102 (such as the lid of DUT 102 or a die contained in DUT 102); these signals are processed by control system 106 according to a temperature control algorithm to generate heater control signal 108. For example, a simple algorithm may adjust heater control signal 108 in response to the measured temperature of DUT 102 such that the operating temperature of DUT 102 is maintained at a specific temperature. Alternatively, the control algorithm may generate heater control signal 108 in response to the input power of DUT 102.

A practical ATC system 100 can be designed to accommodate test temperatures between −55 and 155 degrees Celsius. However, most electronic devices are typically tested at temperatures between 70 and 90 degrees Celsius (these example temperature ranges may change in the future and the present invention is not limited to any specific range of test temperatures). In addition, electronic device test specifications do not usually call for temperature transients, i.e., most electronic testing is performed at a substantially steady state operating temperature. In this respect, ATC system 100 may also include a suitable regulator, e.g., a coolant system 114, that cooperates with heating/cooling assembly 104 to regulate the temperature of the cold source (e.g., a heat sink element). Coolant system 114 regulates the temperature and flow rate of the coolant, pumps the coolant into heating/cooling assembly 104, and receives the return coolant from heating/cooling assembly 104.

ATC system 100 may employ any coolant having the desired thermal properties. For example, ATC system 100 may use water, air, a refrigerant, or any fluid substance. The preferred embodiment utilizes water as the coolant, the flow rate is set at approximately 0.5 to 1.5 gallons per minute, and coolant system 114 maintains the temperature of the water at a temperature below (usually substantially below) the coldest test temperature associated with the particular test specification. Coolant system 114 can also regulate the flow rate to accommodate large temperature changes (which may be required to accommodate single-insertion multiple-temperature testing of a single device).

In operation, ATC system 100 may thermally condition DUT 102 by gradually increasing the temperature of DUT 102 until it reaches the specified operating temperature. DUT 102 is then subjected to the functional testing as required by the test specification. ATC system 100 monitors the temperature of DUT 102 during the functional test and regulates the temperature of the heating element associated with heating/cooling assembly 104. Under most circumstances, coolant system 114 will maintain a steady state coolant temperature and flow rate, which contributes to the regulation of the operating temperature of DUT 102.

Figures 2, 4:
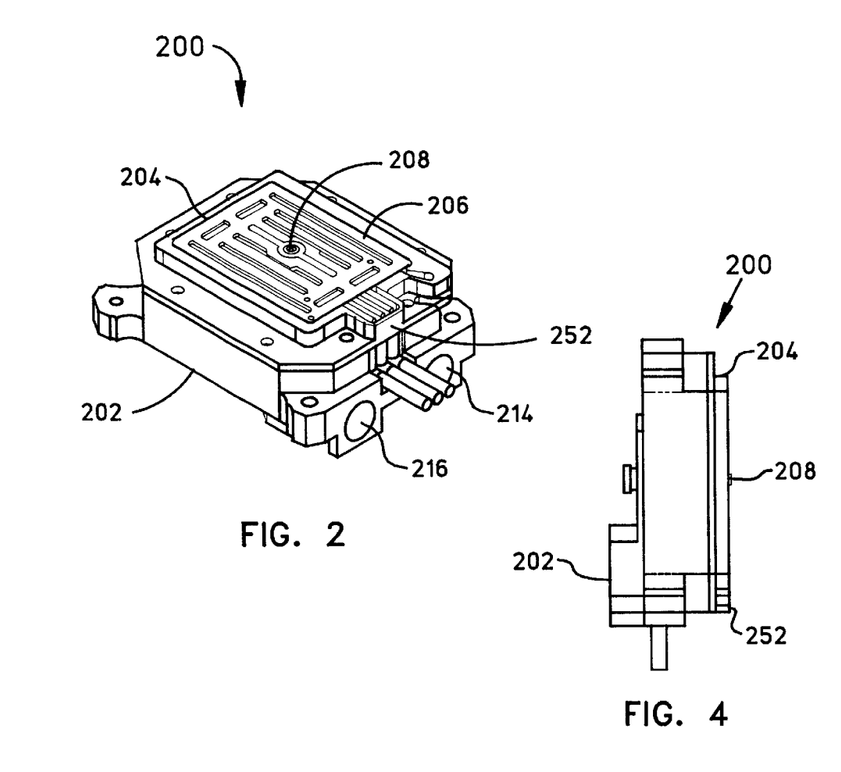
FIG. 2 is a perspective view of a heating/cooling assembly that may be used in the ATC system depicted in FIG. 1.
FIG. 4 is a side view of the heating/cooling assembly shown in FIG. 2.
Figure 3:
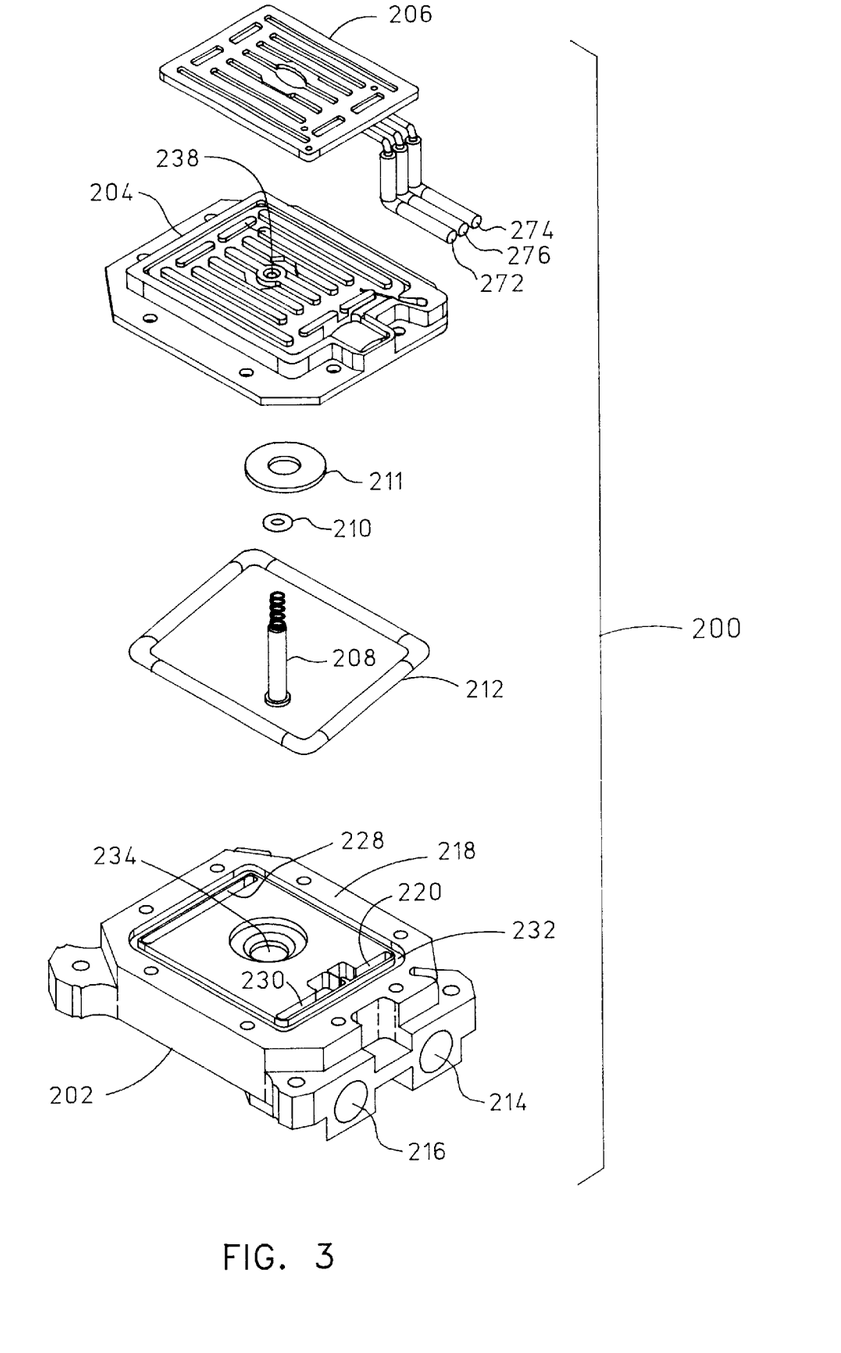
FIG. 3 is an exploded perspective view of the heating/cooling assembly shown in FIG. 2.

FIG. 2 is a perspective view of a heating/cooling assembly 200 that may be used in ATC system 100 described above, FIG. 3 is an exploded perspective view of the same, and FIG. 4 is a side view of the same. Heating/cooling assembly 200 generally includes a base block 202, a heat sink 204, and a heater assembly 206. Heating/cooling assembly 200 may also include a temperature sensor 208 (a significant portion of temperature sensor 208 is obscured from view in FIG. 2 and FIG. 4), an inner seal 210 (shown in FIG. 3), a washer 211, and an outer seal 212 (shown in FIG. 3). Heater assembly 206 is configured to directly heat the DUT by providing a direct thermal path to the DUT. Heat sink 204 is configured to provide a direct thermal path between the DUT and a cold source, e.g., the coolant. Thus, heat sink 204 provides a direct thermally conductive path from the DUT (which contacts the upper surface of the heat sink) to the coolant. In accordance with the preferred embodiment of the present invention, the thermal path between heater assembly 206 and the DUT and the thermal path between heat sink 204 and the DUT correspond to parallel thermal resistances associated with the DUT. In other words, heating/cooling assembly 200 concurrently provides both a heater (or hot source) and a heat sink (or cold source) to the DUT. As best shown in FIG. 2, the upper heating surface of heater assembly 206 and the upper cooling surface of heat sink 204 are substantially coplanar. This coplanar configuration ensures that portions of both heater assembly 206 and heat sink 204 remain in contact with the DUT during the test (in practice, most DUTs have a flat or planar lid that serves as the mating surface). Of course, the size and shape of the upper contact surface of heating/cooling assembly 200 may be suitably configured to mate with the size and shape of the particular DUT. Alternatively, a suitably configured mating element, formed from a thermal conductor, can be placed between heating/cooling assembly 200 and the DUT. A mating element may be desirable to accommodate the specific physical characteristics of the DUT or to concentrate heating or cooling in certain areas of the DUT.

Figure 5:
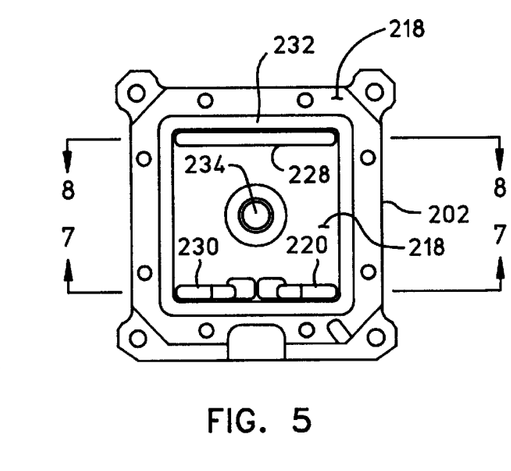
FIG. 5 is a top view of a base block for the heating/cooling assembly shown in FIG. 2.
Figure 6:
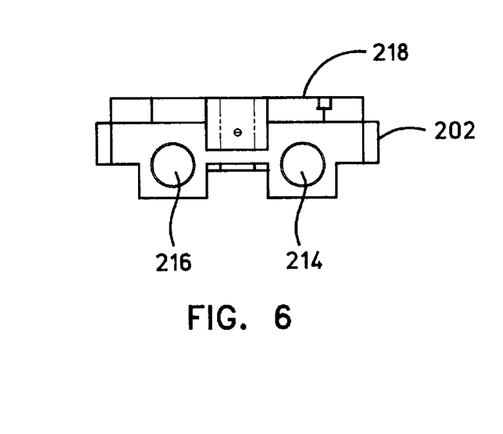
FIG. 6 is a front view of the base shown in FIG. 4.

FIG. 5 is a top view of base block 202 for heating/cooling assembly 200, and FIG. 6 is a front view of the same. Base block 202 serves as a foundation for heating/cooling assembly 200 and can be attached to a chuck or other suitable support structure of the ATC system. Notably, base block 202 is suitably configured to provide a conduit for the heat sink coolant. In accordance with one preferred embodiment, base block 202 is realized as a nickel-plated block of aluminum. Alternatively, base block 202 can be formed from a thermally insulative material (such as plastic), which may be desirable to reduce the amount of heat transfer from heating/cooling assembly 200 to the chuck or support structure. The specific composition and configuration of base block 202 may vary depending upon the practical implementation of the ATC system.

Base block 202 includes a coolant inlet port 214 and a coolant outlet port 216 formed within the body of base block 202. Inlet port 214 and outlet port 216 are both formed proximate one side of base block 202, and both of the ports terminate at one edge of base block 202. Inlet port 214 and outlet port 216 are formed with internal threads such that suitable fluid fittings (not shown) can be attached to base block 202. The fluid fittings receive fluid delivery hoses or conduits that carry the coolant between base block 202 and coolant system 114 (see FIG. 1).

Figure 7:
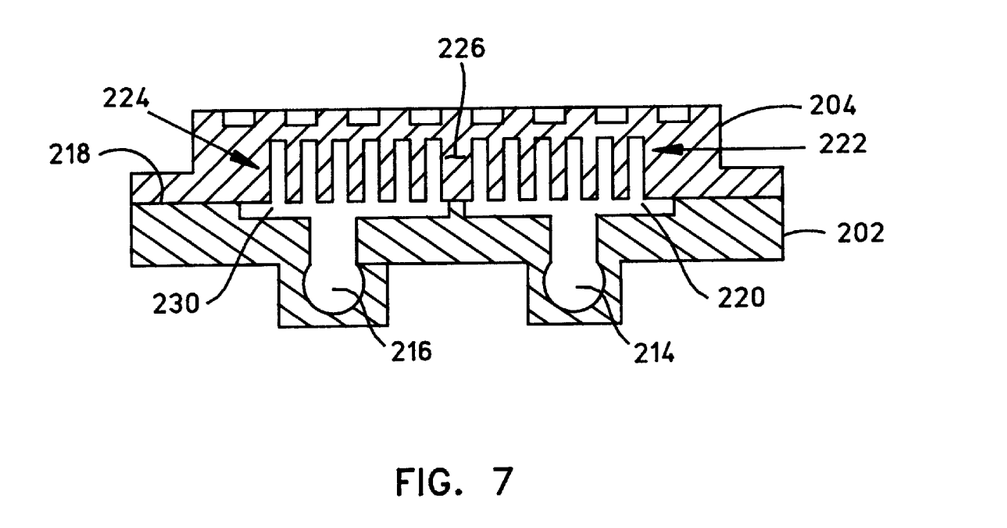
FIG. 7 is a cross sectional view of the heating/cooling assembly taken near the front of the assembly.
Figure 11:
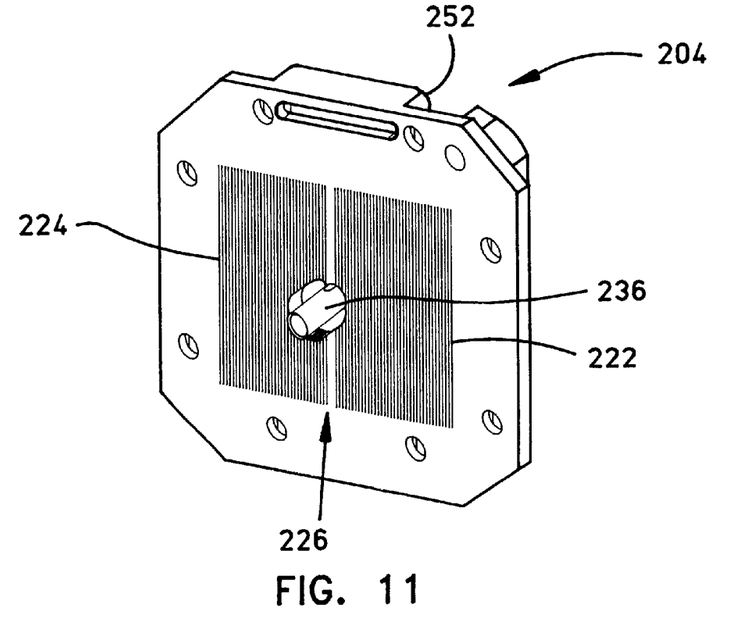
FIG. 11 is a bottom perspective view of the heat sink shown in FIG. 9.
Figure 12:
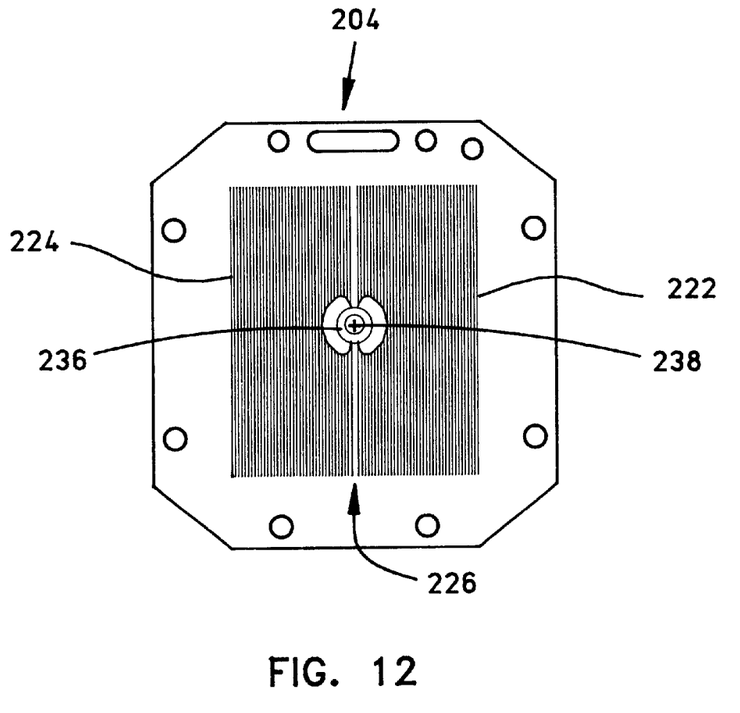
FIG. 12 is a bottom view of the heat sink shown in FIG. 9.

The example base block 202 shown herein includes a coolant inlet path 220 formed within the body of base block 202. Inlet path 220 fluidly communicates with coolant inlet port 214, thus creating a continuous fluid conduit through inlet port 214 and inlet path 220. Base block 202 includes a top portion 218 that mates with the bottom surface of heat sink 204. Base block 202 and heat sink 204 are cooperatively configured such that they define a coolant path when coupled together. With additional reference to FIG. 7 (which represents a cross section of heating/cooling assembly 200 as viewed from the perspective of line 7—7 in FIG. 5), the coolant enters inlet port 214, travels within inlet path 220, and eventually reaches a portion of heat sink 204. As shown in FIGS. 11 and 12, heat sink 204 includes a first plurality of cooling fins 222 and a second plurality of cooling fins 224. The two sets of cooling fins are separated by a central rib 226. Upon reaching heat sink 204, the coolant flows between the first plurality of cooling fins 222 from the front to the rear of heating/cooling assembly 200 (i.e., in the direction away from inlet port 214). Central rib 226, the configuration of coolant inlet path 220, and the presence of fluid seals (described in more detail below) ensures that the entering coolant flows within the first plurality of cooling fins 222.

Figure 8:
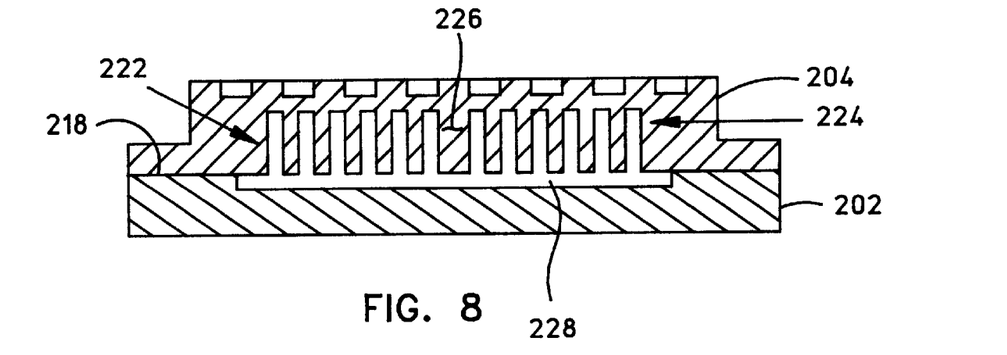
FIG. 8 is a cross sectional view of the heating/cooling assembly taken near the rear of the assembly.

After the coolant flows between the first plurality of cooling fins 222, it enters an exchange path 228 formed within base block 202. As shown in FIG. 8 (which represents a cross section of the heating/cooling assembly 200 as viewed from the perspective of line 8—8 in FIG. 5), exchange path 228 fluidly connects the first and second sets of cooling fins. Consequently, the coolant flows from the ends of the first plurality of cooling fins 222, down into exchange path 228, under central rib 226, and into the ends of the second plurality of cooling fins 224. Thereafter, the coolant flows between the second plurality of cooling fins 224 in a direction toward coolant outlet port 216. As described above, the second plurality of cooling fins 224 are separated from the first plurality of cooling fins 222 by central rib 226. During normal operation, positive fluid pressure generated by the coolant system causes the coolant to traverse up and back through the heat sink 204 to thereby cool the DUT. Eventually, the coolant reaches a coolant outlet path 230 formed within base block 202 and located near the front portion of base block 202. Outlet path 230 provides a fluid conduit from heat sink 204 to outlet port 216, thus serving as a return path for the coolant.

Heating/cooling assembly 200 may include any number of fluid seals, gaskets, adhesives, washers, or other elements that function to seal the assembly and to prevent the coolant from leaking (internally or externally). For example, the practical embodiment shown herein employs inner seal 210 and outer seal 212 to maintain the fluid integrity of heating/cooling assembly 200. Outer seal 212 is placed in a channel 232 formed within the upper surface of base block 202; channel 232 defines a perimeter that surrounds the outer periphery of the cooling fins when heat sink 204 is coupled to base block 202. Outer seal 212 becomes compressed when heat sink 204 is coupled to base block 202, thus forming a fluid seal that contains the coolant within heating/cooling assembly 200. Inner seal 210 surrounds temperature sensor 208 and is received within a bore 234 formed within base block 202. Once installed, inner seal 210 forms a fluid seal around a cylindrical tube element 236 (see FIG. 11), which is attached to heat sink 204. Temperature sensor 208 is installed into cylindrical tube 236, which provides a collar around which inner seal 210 engages. In a practical embodiment, cylindrical tube 236 is made of copper to facilitate soldering to the body of heat sink 204. Alternately, cylindrical tube 236 can be formed from a thermal insulator such that the heat from heat sink 204 and heater assembly 206 is isolated from temperature sensor 208.

Temperature sensor 208 can be coupled to heating/cooling assembly 200 in any suitable manner. In the practical embodiment shown herein, temperature sensor 208 is mounted to base block 202 such that temperature sensor 208 is maintained in a central position within heating/cooling assembly 200. Temperature sensor 208 is positioned such that it remains thermally isolated from heater assembly 206 and from heat sink 204. In other words, temperature sensor 208 preferably does not directly measure the temperature of heater assembly 206 or heat sink 204. In operation, temperature sensor 208 "floats" within a hole 238 formed within tube element 236 and heat sink 204 such that it does not physically contact heat sink 204 or heater assembly 206. Temperature sensor 208 is spring-loaded such that the tip, which protrudes slightly above the top surface of heating/cooling assembly 200 (see FIG. 4), remains in contact with the DUT during testing. Although not shown, the electrical signal generated by temperature sensor 208 is carried by a wire that communicates with the ATC control system.

Figure 9:
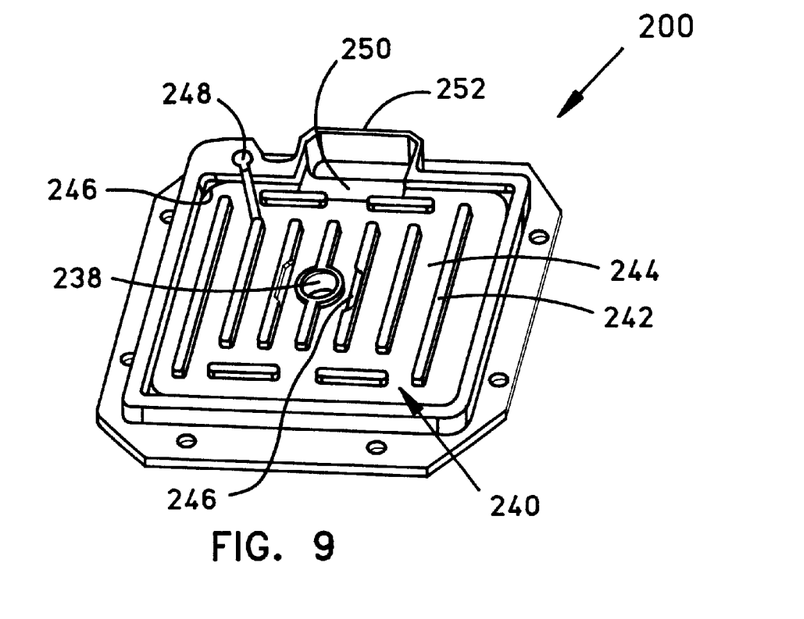
FIG. 9 is a top perspective view of a heat sink for the heating/cooling assembly shown in FIG. 2.
Figure 10:
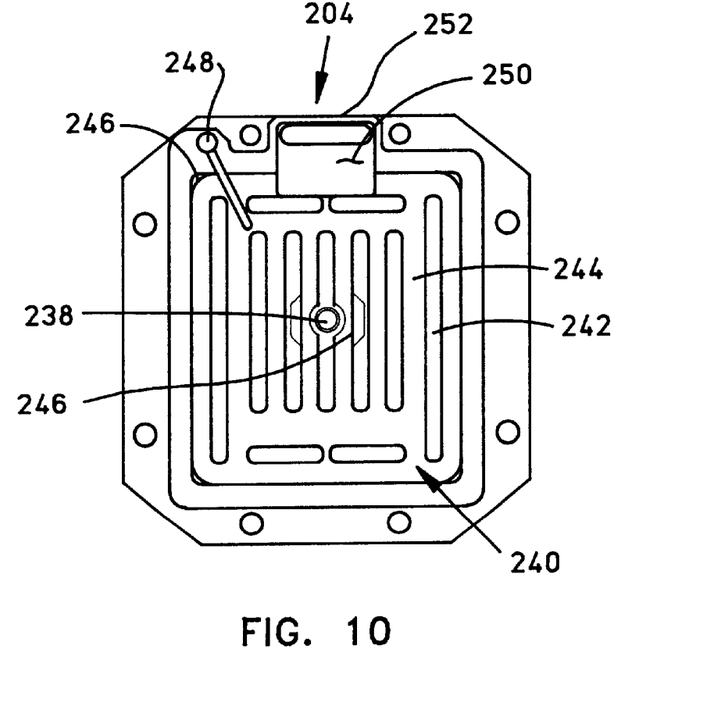
FIG. 10 is a top view of the heat sink shown in FIG. 9.

FIGS. 9–12 are various views of heat sink 204. Heat sink 204 is formed from a material that is a good thermal conductor, such as copper. In a preferred practical embodiment, heat sink 204 is milled out of a single block of copper. The top side (the side exposed to the DUT) of heat sink 204 is configured to receive heater assembly 206. In this respect, heat sink 204 includes an inlay pattern 240 formed therein; inlay pattern 240 is configured such that it mates with a hole pattern contained in heater assembly 206. As best shown in FIG. 9, heat sink 204 may include any number of ribs (or protrusions) 242 that are separated by any number of channels 244. The embodiment shown in FIG. 9 includes seven ribs 242 that are parallel to the cooling fins, and four ribs 242 that are perpendicular to the cooling fins.

In accordance with one practical embodiment, each rib 242 is approximately 0.078 inches wide and approximately 0.041 inches high, relative to the bottom surface of channels 244. In addition, each channel 244 between the ribs 242 is approximately 0.112 inches wide.

The upper surfaces of ribs 242 may be coplanar to accommodate DUTs having a flat lid. The coplanar upper surfaces contact the DUT during testing to provide a direct cold source for purposes of temperature control. The bottom surfaces of channels 244 are coplanar except for a number of ridges 246 that extend above the coplanar surface. These raised ridges 246 position heater assembly 206 slightly above the bottom surface of channels 244. As described in more detail below, this offset allows a thin layer of thermally insulating adhesive (applied during the manufacture of heating/cooling assembly 200) to remain between heater assembly 206 and heat sink 204.

Heat sink 204 may also include a suitably placed channel 248 configured to carry a thermocouple sensor wire that enables the control system to monitor the temperature of heater assembly 206 or heat sink 204. The temperature of heater assembly 206 or heat sink 204 may be used as a safety measure (to detect overheating), as a feedback signal to adjust the temperature of heater assembly 206, and/or as a feedback signal to adjust the temperature or flow rate of the coolant. In a practical embodiment, channel 248 is formed below the bottom surface of the heat sink channels 244 such that the signal wire does not interfere with the mating of heater assembly 206 and heat sink 204.

Heat sink 204 also includes a depression or pocket 250 formed below the bottom surface of the heat sink channels 244. Pocket 250 is surrounded by a collar 252, which has an upper edge surface that is coplanar with the upper surfaces of heat sink ribs 242. As described in more detail below in connection with the manufacturing of heating/cooling assembly 200, pocket 250 and collar 252 are configured to receive and secure a number of electrical wires associated with heater assembly 206.

As mentioned above, heat sink 204 includes a number of cooling fins that are configured and arranged to promote heat transfer from heat sink 204 to the coolant. As shown in FIGS. 11 and 12, the example heat sink 204 includes a plurality of parallel cooling fins that are also parallel to the majority of the heat sink ribs 242. In accordance with a practical embodiment, each of the cooling fins is approximately 0.012 inches thick and approximately 1.280 inches long. Furthermore, neighboring cooling fins are separated by approximately 0.012 inches. Alternatively, heat sink 204 may employ any suitable cooling fin design and the particular design may depend on any number of parameters such as the thermal properties of the heat sink material, the thermal and physical properties of the coolant, the flow rate of the coolant, the size of heat sink 204, and the like.

Figure 13:
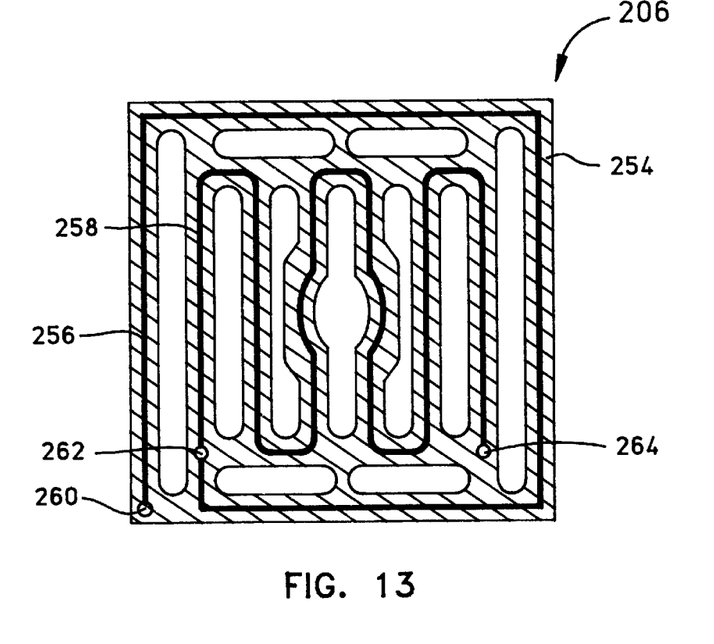
FIG. 13 is a top view of a heater element for the heating/cooling assembly.
Figure 14:
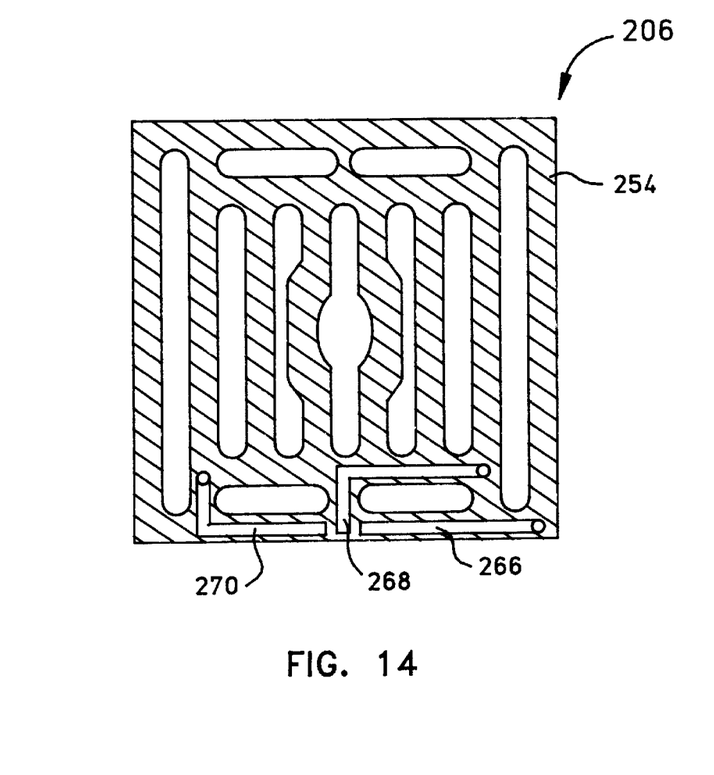
FIG. 14 is a bottom view of the heater element shown in FIG. 13.

FIG. 13 is a top view of heater assembly 206 (with an internal layer exposed for illustrative purposes) and FIG. 14 is a bottom view of heater assembly 206. Generally, heater assembly 206 includes a heating surface (the exposed upper surface) that, in operation, is coplanar with the cooling surface of heat sink ribs 242. Heater assembly 206 includes a substrate 254 and at least one heating element 256, 258 formed on substrate 254. Substrate 254 is preferably sized, shaped, and configured to mate with inlay pattern 240 defined by heat sink ribs 242 and channels 244. In this respect, heater assembly 206 may include a hole pattern formed therein; the various holes correspond to heat sink ribs 242.

Substrate 254 may be formed from any suitable material that is electrically insulative (which facilitates the use of an electrical heater element on the substrate). One preferred embodiment utilizes a ceramic alumina substrate 254 having a coefficient of thermal expansion that is compliant with the coefficient of thermal expansion of the copper heat sink 204, considering the difference in temperature during normal operation. In addition, the use of a suitable adhesive between substrate 254 and heat sink 204 allows the respective coefficients of thermal expansion to differ. In one practical embodiment, the coefficient of thermal expansion of substrate 254 is about $3.5\times10^{-6}/°$ F., and the coefficient of thermal expansion of heat sink 204 is about $9.8\times10^{-6}/°$ F. Thus, heater assembly 206 and the heat sink 204 expand and contract as a single unit, thus reducing the physical stress on the components caused by thermal cycling. Depending upon the particular application, the specific type of alumina substrate material may have relatively high thermal conductivity or relatively low thermal conductivity. A high thermal conductivity, while possibly resulting in a less thermally efficient heating element, reduces thermal gradients within alumina substrate 254 and results in less thermal stress. On the other hand, a substrate having a relatively low thermal conductivity may lose less heat to the surrounding heat sink 204.

Electrically conductive "ink" is used to form the heating elements 256, 258. In accordance with one practical embodiment, the conductive ink includes a palladium/silver alloy having a relatively high electrical resistance. Substrate 254 is patterned and the conductive ink is printed onto the surface of substrate 254 to a thickness of approximately 0.0005 inches. The practical embodiment shown in FIG. 13 employs an outer heating element 256, which originates at a signal feed point 260, travels around the perimeter of substrate 254, and terminates at a common ground point 262. In addition, an inner heating element 258 originates at a second signal feed point 264, travels between several holes in a serpentine manner, and also terminates at common ground point 262. Heating/cooling assembly 200 employs two distinct heating elements so that it can accommodate relatively large and relatively small DUTs. For example, the temperature of a relatively small DUT with a small lid can be efficiently regulated using only inner heater element 258; the use of outer heater element 256 on a small DUT may be a waste of power and may cause overheating of outer heater element 256. On the other hand, both heater elements 256, 258 may be activated if the DUT is relatively large.

The signal feed points 260, 264 and common ground point 262 provide an electrically conductive path from the top surface of substrate 254 to the bottom surface of substrate 254. During manufacture of heater assembly 206, small vias, holes, or equivalent pathways are formed in substrate 254 at these three points. As shown in FIG. 14, the bottom surface of substrate 254 includes electrically conductive traces 266, 268, 270 corresponding to signal feed point 260, common ground point 262, and signal feed point 264, respectively. These traces may be formed from any suitable material such as copper or silver. The vias are filled with a metal material, e.g., silver, to form conductive paths between traces 266, 268, 270 and the corresponding heating elements 256, 258. During the manufacture of heater assembly 206, two signal wires 272, 274 and a common ground wire 276 are soldered or otherwise attached to the respective traces 266, 268, 270. These wires carry the respective heater control signals from the ATC control system.

Figure 15:
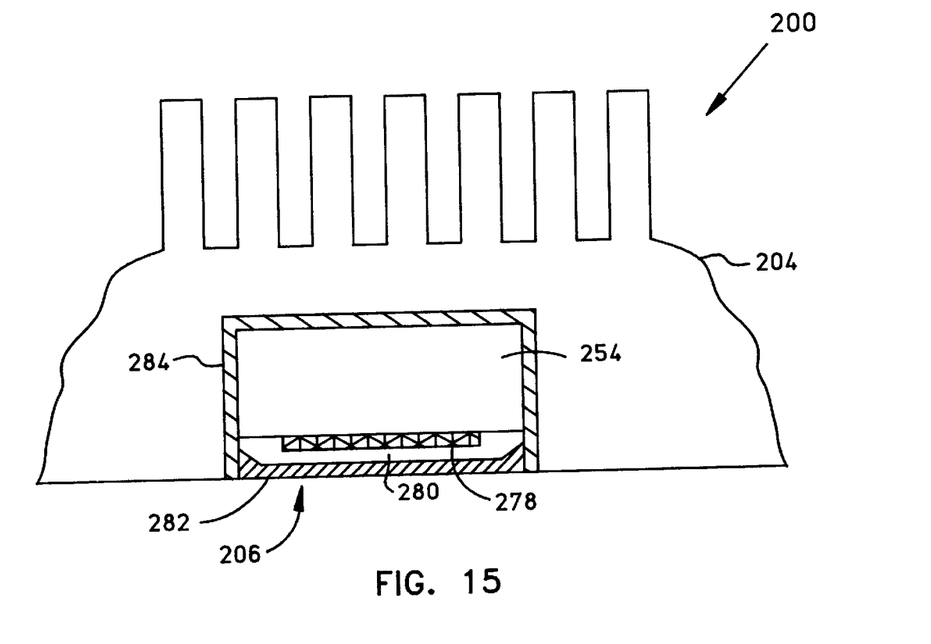
FIG. 15 is a cross sectional view of a detailed portion of the heater and heat sink assembly.

In a practical embodiment, electrical heating elements 256, 258 are not exposed to the DUT. Rather, one or more protective layers are deposited over heating elements 256, 258. FIG. 15 a cross sectional view of a detailed portion of heating/cooling assembly 200. FIG. 15 represents a perpendicular cross section across one heat sink channel (viewed from the same perspective as in FIGS. 8 and 9). FIG. 15 shows the cross section of a portion of heater substrate 254 and the cross section of a heating element 278 that has been deposited onto substrate 254. In the preferred embodiment, the heating elements are covered with a thin layer of glass dielectric material 280 such as polycrystalline glass. Dielectric layer 280 is deposited over the heating elements (and optionally over the remaining surface of the substrate) to a thickness of approximately 0.0015 inches. The glass material is electrically non-conductive and has relatively low thermal conductivity. Consequently, the dielectric layer 280 is kept very thin so that it does not restrict the transfer of heat from heating element 278 to the DUT. The heater assembly 206 may utilize alternative materials (other than glass) for dielectric layer 280, e.g., alumina or other ceramic materials, for higher thermal conductivity.

Heater assembly 206 includes a final protective layer 282 that preferably covers the entire upper exposed surface of substrate 254. Protective layer 282 may be formed from any suitable material having relatively high thermal conductivity, such as a silver alloy. Protective layer 282 is deposited to a thickness of up to approximately 0.003 inches. Protective layer 282 may be over-deposited such that a small amount of its exposed surface can be removed during a lapping procedure during the final assembly of heating/cooling assembly 200. As described in more detail below, this excess material is eventually removed such that protective layer 282 is coplanar with heat sink 204 (as depicted in FIG. 15). The high thermal conductivity of protective layer 282 is desirable to increase the effective surface area of the heating elements; the exposed surface of protective layer 282 ultimately contacts the DUT.

The individual components described above can be assembled in the following manner. The heater signal wires 272, 274, 276 are attached to the respective traces 266, 270, 268 to form an electrically conductive joint. For example, the signal wires may be soldered or bonded to the traces. In a practical embodiment, the lengths of the signal wires may be longer than that depicted in the figures. An optional thermal sensor can be installed in channel 248 with the sensor tip attached to either heat sink 204 (using a suitable adhesive) or substrate 254 (using a suitable adhesive or solder). Heater assembly 206 is then attached to heat sink 204 to form an integrated component. Heater assembly 206 may be affixed to heat sink 204 using a suitable adhesive, such as a silicone adhesive. As described above, a number of ridges 246 on heat sink 204 provide an offset such that a thermal insulation layer can be formed or placed between heater assembly 206 and heat sink 204. In the practical embodiment described herein, the adhesive material serves as this insulation layer (while also serving as an electrical insulator). A typical silicone adhesive may have a coefficient of thermal conductivity of approximately 0.85 Watt/m-° K. (which equals 4.9 Btu-ft/ft$^2$-h-° F.). FIG. 15 depicts an insulation layer 284 in place after heater assembly 206 has been coupled to heat sink 204. Thermal insulation layer 284 is preferably located between the mating lower surfaces and the mating side surfaces, i.e., other than the exposed upper surface, insulation layer 284 surrounds heater assembly 206. The thickness (bottom and sidewall) of insulation layer 284 may be approximately 0.006 inches in a practical embodiment. Thermal insulation layer 284 reduces the amount of direct heat transfer from heater assembly 206 to heat sink 204. Thus, the majority of the heat generated by heater assembly 206 is transferred to the DUT via the exposed upper surface of heater assembly 206 and only a small amount of the heat is transferred from heater assembly 206, through insulation layer 284, and to heat sink 204.

During assembly, the uncured adhesive material is initially deposited within channels 244 and within pocket 250. If applicable, a suitable thermocouple and lead wire (not shown) may be placed within channel 248 in a position that allows the thermocouple to monitor the temperature of heater assembly 206 and/or heat sink 204. As best shown in FIGS. 2, 3, 9, and 10, the signal wires are threaded into collar 252 before heater assembly 206 is affixed to heat sink 204. Thereafter, heater assembly 206 is inserted into heat sink 204 such that the uncured adhesive material fills the spaces between heater assembly 206 and heat sink 204 (in practice, a small amount of the uncured adhesive material may be squeezed above the upper surface of heater assembly 206). When heater assembly 206 is coupled to heat sink 204, the hole pattern of heater assembly 206 receives the corresponding ribs 242 of heat sink 204.

The adhesive material also serves as a potting material that secures the signal wires 272, 274, 276 to heat sink 204. The uncured adhesive also fills the space in pocket 250, as defined by collar 252. An amount of uncured adhesive may also be deposited over the portion of the signal wires 272, 274, 276 that reside within pocket 250. After the adhesive material has cured, heater assembly 206 is effectively bonded to heat sink 204 and the adhesive material serves as insulation layer 284. In addition, the cured adhesive material, in conjunction with pocket 250 and collar 252, functions to secure the signal wires 272, 274, 276 to the integrated component. This arrangement provides a stress relief point for the bonds between the signal wires and the electrical traces on heater assembly 206.

After the adhesive has cured, the upper exposed surface of the integrated assembly is lapped down to remove any excess adhesive and to create a coplanar surface. Before lapping, protective layer 282 of heater assembly 206 may be slightly higher or slightly lower than the upper surface of heat sink 204. The lapping process may remove a small amount of heat sink 204 and/or a small amount of protective layer 282, thus ensuring that the heating surface of heater assembly 206 and the cooling surface of heat sink 204 are coplanar. In this manner, heater assembly 206 and heat sink 204 are configured to concurrently contact the DUT and to concurrently provide two different thermal paths to the DUT.

As an optional step, the combined heater and heat sink component may be plated or otherwise protected against oxidation or corrosion. For example, the component can be plated with a thin layer of gold to protect the copper heat sink 204.

Next, outer seal 212 (see FIG. 3) is placed into the corresponding channel 232 and the combined heater and heat sink component is coupled to base block 202. In addition, inner seal 210 may be installed at this time. The preferred practical embodiment utilizes screws (not shown) to attach the flange of heat sink 204 to base block 202. As described above, outer seal 212 is compressed when the heater and heat sink component is coupled to base block 202, thus forming a fluid seal around the perimeter of the cooling fin pattern (see FIGS. 11 and 12).

Temperature sensor 208 and inner seal 210 may be suitably coupled to base block 202 in a manner that ensures that temperature sensor 208 is thermally isolated from heater assembly 206 and heat sink 204. As shown in FIG. 2, the tip of temperature sensor 208 protrudes through the tube element 236 and the central hole formed within heat sink 204 and heater assembly 206. Inner seal 210 is configured to form a fluid seal between tube element 236 and the central portion of heat sink 204. Thus, inner seal 210 maintains the integrity of the coolant flow path described above (the coolant flows through the first plurality of cooling fins 222 on the first side of heat sink 204, then flows through the second plurality of cooling fins 224 on the opposite side of heat sink 204) while allowing removal and replacement of temperature sensor 208 without causing fluid leaks.

Prior to operation, fluid fittings (not shown) can be attached to coolant inlet port 214 and to coolant outlet port 216 to facilitate connection of heating/cooling assembly 200 to coolant system 114 (see FIG. 1). In addition, one or more heating/cooling assemblies can be attached to a test chuck, and any number of test chucks can be associated with a single testing tool.

As described above in connection with FIG. 1, heating/cooling assembly 200 is preferably utilized to regulate the temperature of a DUT. In operation, heating/cooling assembly 200 applies a cold source (e.g., heat sink 204) to a first portion of the DUT and concurrently applies a hot source (e.g., heater assembly 206) to a second portion of the DUT in response to a temperature setting. The temperature setting may be dictated by the particular test specification, and the temperature setting is typically regulated by control system 106. Control system 106 may generate a suitable control signal that controls the temperature of heater assembly 206 based upon the current test temperature setting and/or other measured test conditions. For example, temperature sensor 208 (which is configured to contact a portion of the DUT during testing) may generate a signal indicative of the temperature of the DUT and control system 106 may also utilize the signal to regulate the temperature of heater assembly 206.

Figure 16:
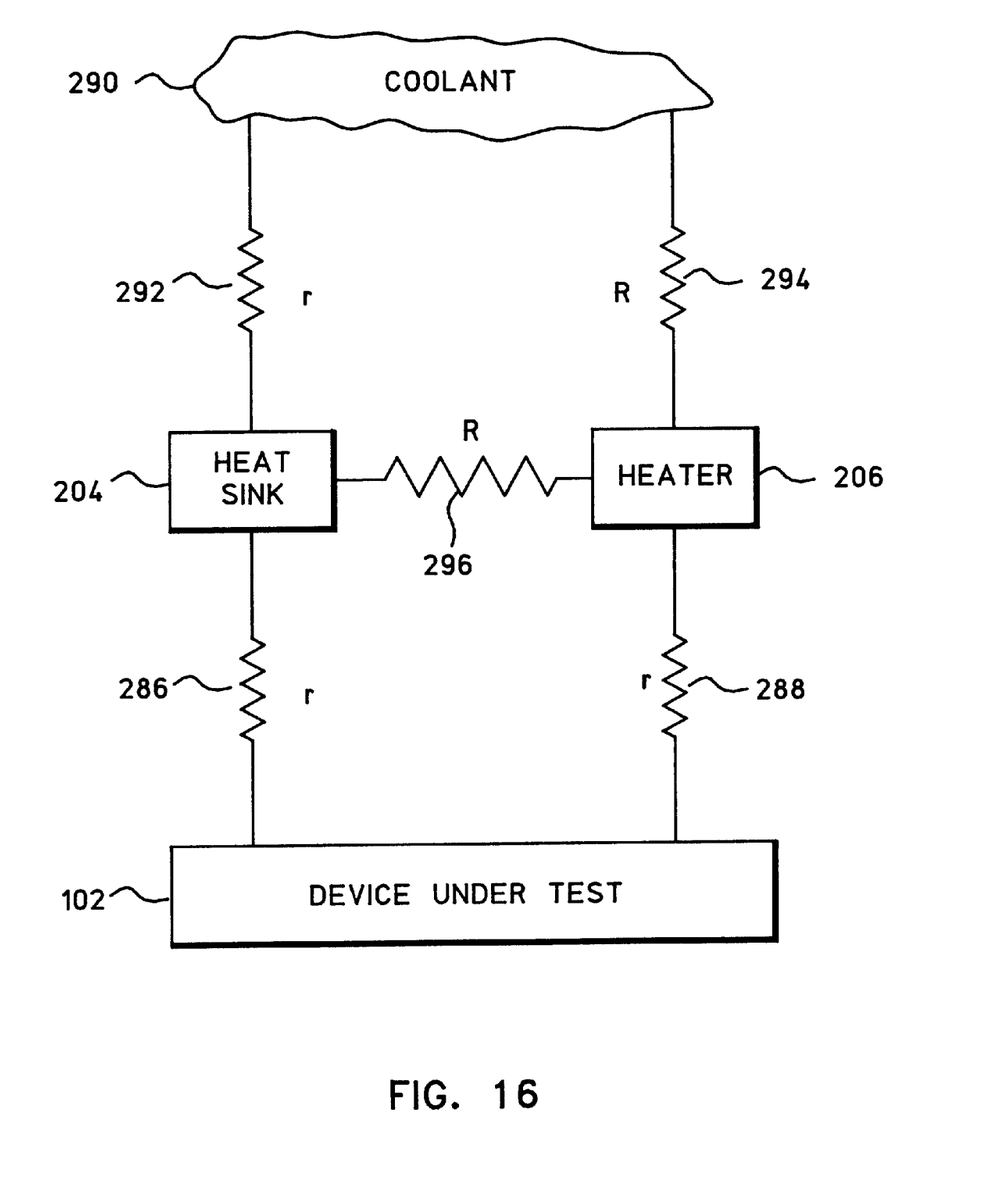
FIG. 16 is a thermal resistance diagram of the heater and heat sink assembly in operation.

FIG. 16 is a thermal resistance diagram of heating/cooling assembly 200. Heat sink 204 and heater element 206 are cooperatively configured to provide parallel thermal paths to DUT 102. As shown, heat sink 204 is coupled to DUT 102 through an insignificant thermal resistance identified by reference number 286. This resistance 286 is very low because it represents the thermal resistance of the junction between heat sink 204 and DUT 102. Similarly, heater assembly 206 is coupled to DUT 102 through an insignificant thermal resistance identified by reference number 288. Two direct thermal paths are established from heating/cooling assembly 200 to DUT 102 as a result of the physical contact between DUT 102 and heat sink 204 and as a result of the physical contact between DUT 102 and heater assembly 206.

Another thermal path is established between heat sink 204 and the coolant 290. This thermal path is characterized by an insignificant thermal resistance identified by reference number 292. This thermal resistance 292 represents the thermal resistance of the junction between heat sink 204 and coolant 290. Although not depicted as a resistance in FIG. 15, heat sink 204 itself has a thermal resistance associated with the heat sink material. In practice, the thermal resistance of heat sink 204 should be relatively low. For example, a practical embodiment may employ a copper heat sink 204 having a coefficient of thermal conductivity equal to approximately 390 Watt/m-° K. (which equals approximately 226 Btu-ft/ft$^2$-h-° F.). Consequently, the overall thermal path from DUT 102 to coolant 290 via heat sink 204 is characterized by a relatively low thermal resistance.

In contrast to the very low thermal resistance 292, the thermal resistance of the path between heater assembly 206 and coolant 290 is significant. This relatively high thermal resistance is identified by reference number 294. As described above, thermal insulation layer 284 (see FIG. 15) is suitably configured to reduce the amount of heat transfer from heater assembly 206 to heat sink 204. Thus, a relatively high thermal resistance (identified by reference number 296) defines the thermal path between heater assembly 206 and heat sink 204. In turn, this reduces the amount of heat transfer from heater assembly 206 to coolant 290. Accordingly, the majority of the heat generated by heater assembly 206 is directly applied to DUT 102, thus improving the efficiency of heating/cooling assembly 200. The heat generated by heater assembly 206 is removed from DUT 102 via heat sink 204; the thermal resistance of DUT 102 itself is very low. Unlike some prior art designs, which have a heater element in series with a heat sink element, heat from the DUT 102 need not travel through heating assembly 206 before it reaches heat sink 204.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A temperature control apparatus comprising:
   a heater assembly configured to heat a device under test; and
   a heat sink coupled to said heater assembly and configured to provide a direct thermal path between said device under test and a cold source; wherein said heater assembly comprises a heating surface and said heat sink comprises a cooling surface that is coplanar with said heating surface.

2. An apparatus according to claim 1, wherein said heater assembly comprises a substrate and at least one heating element formed on said substrate.

3. An apparatus according to claim 1, wherein:
   said heater assembly comprises a substrate having a hole pattern formed therein; and
   said heat sink comprises an inlay pattern configured to receive said heater assembly such that said inlay pattern mates with said hole pattern.

4. An apparatus according to claim 3, further comprising a thermal insulation layer located between said heater assembly and said heat sink.

5. An apparatus according to claim 1, wherein said heat sink comprises:
   a cooling surface that provides a first thermal path to said device under test; and
   a plurality of cooling fins that provide a second thermal path to a coolant.

6. An apparatus according to claim 5, further comprising a base coupled to said heat sink, said base being configured to provide said coolant to said plurality of cooling fins.

7. A temperature control apparatus comprising:
   a heater assembly configured to provide a first thermal path to a device under test; and
   a heat sink configured to provide a second thermal path to said device under test, said first and second thermal paths corresponding to parallel thermal resistances associated with said device under test; wherein said heater assembly comprises a heating surface and said heat sink comprises a cooling surface that is coplanar with, and physically distinct from, said heating surface.

8. An apparatus according to claim 7, wherein said heat sink is configured to provide said second thermal path between said device under test and a cold source.

9. An apparatus according to claim 7, wherein said heater assembly and said heat sink are configured to concurrently provide said first and second thermal paths to said device under test.

10. An apparatus according to claim 7, wherein said heater assembly comprises a heating surface and said heat sink comprises a cooling surface that is coplanar with said heating surface.

11. An apparatus according to claim 7, wherein at least a portion of said heating surface and at least a portion of said cooling surface are configured to concurrently contact said device under test.

12. An apparatus according to claim 7, wherein said heater assembly comprises a substrate and at least one heating element formed on said substrate.

13. An apparatus according to claim 7, wherein:
   said heater assembly comprises a substrate having at least one hole formed therein; and
   said heat sink is coupled to said heater assembly such that said at least one hole receives a portion of said heat sink.

14. An apparatus according to claim 13, further comprising a thermal insulation layer located between said heater assembly and said heat sink.

15. An apparatus according to claim 7, wherein said heat sink comprises:
   a cooling surface that provides said second thermal path to said device under test; and
   a plurality of cooling fins that provide a third thermal path to a coolant.

16. An apparatus according to claim 15, further comprising a base coupled to said heat sink, said base being configured to provide said coolant to said plurality of cooling fins.

17. An apparatus according to claim 7, further comprising a temperature sensor that is thermally isolated from said heater assembly and from said heat sink, said temperature sensor being configured to measure the temperature of said device under test.

18. A temperature control system according to claim 17, wherein at least a portion of said heating surface and at least a portion of said cooling surface are configured to concurrently contact said device under test.

19. A temperature control system according to claim 17, wherein said heater assembly comprises a substrate and at least one heating element formed on said substrate, said at least one heating element being configured to receive a control signal from said control system.

20. A temperature control system according to claim 17, wherein:
   said heater assembly comprises a substrate having at least one hole formed therein; and
   said heat sink is coupled to said heater assembly such that said at least one hole receives a portion of said heat sink.

21. A temperature control system according to claim 20, further comprising a thermal insulation layer located between said heater assembly and said heat sink.

22. A temperature control system according to claim 18, further comprising a temperature sensor configured to generate a signal indicative of the temperature of said device under test, wherein said control system utilizes said signal to regulate the temperature of said hot source.

* * * * *